United States Patent [19]

Yokochi et al.

[11] Patent Number: 5,397,918
[45] Date of Patent: Mar. 14, 1995

[54] CERAMIC PACKAGE FOR HOUSING A SEMICONDUCTOR DEVICE

[75] Inventors: Masao Yokochi; Yikio Katutani, Mine; Kohichi Kumazawa, Kakamigawara; Tetuo Nomura, Fukui, all of Japan

[73] Assignee: Sumitomo Metal Ceramics, Inc., Yamaguchi, Japan

[21] Appl. No.: 855,268

[22] Filed: Mar. 23, 1992

[30] Foreign Application Priority Data

Mar. 21, 1991 [JP] Japan .................. 3-083333

[51] Int. Cl.$^6$ .................. H01L 23/02; H01L 23/12
[52] U.S. Cl. .................. 257/703; 257/668; 257/666
[58] Field of Search .............. 257/666, 668, 671, 704, 257/701, 703, 710

[56] References Cited

U.S. PATENT DOCUMENTS 4,796,083 1/1989 Cherukuri et al. .................. 257/666
4,992,628 2/1991 Beppu et al. .................. 257/668

FOREIGN PATENT DOCUMENTS 1111342 4/1989 Japan .
1-278760 9/1989 Japan .

*Primary Examiner*—Rolf Hille
*Assistant Examiner*—S. V. Clark
*Attorney, Agent, or Firm*—Morrison Law Firm

[57] ABSTRACT

A glass sealing type ceramic package comprises: a ceramic substrate having a cavity for disposing a semiconductor device therein and a glass layer on a first main surface of the ceramic substrate, a ceramic cap having a glass layer on a second main surface thereof, a plurality of lead frames supported by opposing the first and second main surfaces to each other, and the semiconductor device being hermetically sealed in the cavity by fusing the first and second glass layers. According to a feature of this invention, the first main surface of the ceramic substrate is formed by a metallized layer; the glass layer is formed on the metallized layer, leaving a narrower outer periphery of the substrate; 70 to 90% of said lead frames are connected directly to a pad of the semiconductor device by way of metal wires; and a remainder thereof is connected indirectly to the pad of the semiconductor device by way of the metallized layer.

5 Claims, 3 Drawing Sheets

CERAMIC PACKAGE FOR HOUSING A SEMICONDUCTOR DEVICE

BACKGROUND OF THE INVENTION

This invention relates to a glass sealing type ceramic package, and more particularly to a glass sealing type ceramic package having a high density wire bonding enabling a high speed operation.

A conventional glass sealing type ceramic package is shown in FIG. 6, which includes a cavity b for storing a semiconductor device a, a ceramic substrate e having a first glass layer d on a first surface c, a ceramic cap h having a second glass layer g on a second surface f and a lead frame i. Lead frame i is supported and fixed by ceramic substrate e and ceramic cap h, opposing first and second surface c, f to each other. By fusing both first and second glass layers d, g and uniting them integrally, semiconductor device a is sealed hermetically in cavity b.

In connection with a high integration and high density of the semiconductor device, such glass sealing type ceramic package has a rectangular configuration. Usually, a so-called Cer Quad Package having lead frames in four directions is used widely. As shown in FIG. 6, the foregoing ceramic package has one stage lead frame electrically connected to semiconductor device a. In recent years, the number of gates is increased and a multipin or multi-lead frame is becoming more and more popular, so that the width of each lead frame is inevitably narrower and longer. As a result, the electrical properties such as wiring inductance .or conductivity resistance are deteriorated, thereby such ceramic package becomes unsuitable for use of a high speed semiconductor device.

When the semiconductor device is actuated at a high speed, the following problems take place: (1) A certain noise occurs in a ground and a power source. Since the value of noise is expressed with L (di/dt), dt becomes smaller and then the value of noise is greater, thereby causing malfunction. (2) When using such ceramic package in a higher frequency range, a signal transmission due to the inductance and capacitance of a signal pin is delayed.

To cope with the foregoing problems, the following ceramic package has been proposed in recent years. 1) A two-stage lead frame is supported and fixed by a glass layer as shown in FIG. 7. 2) In a ceramic package having a multilayer wiring structure, an internal wiring of one layer is a single power source wiring and connected to that of the other layer by way of a through hole or the like. Thus, the other lead frames can be used effectively for signal transmission. Refer to Japanese laid-open Patent Publication No. 1-111342. 3) By disposing a metallized layer on the bottom of the ceramic package, which will constitute a ground electric potential, the inductance and capacitance are kept constant. Refer to Japanese Laid-open Patent Publication 1-278760.

According to the foregoing conventional ceramic package, the lead frames, a wiring layer in a single power source and a metallized layer are placed one above another, thereby the ceramic package becomes complicated and its production cost becomes expensive.

OBJECTS AND SUMMARY OF THE INVENTION

It is therefore a main object of this invention to provide a glass sealing type ceramic package enabling a high density wiring bonding and a high speed operation.

It is another object of this invention to provide a glass sealing type ceramic package, in which its structure is compact, its production process is easy and its production cost is inexpensive.

Briefly stated, the glass sealing type ceramic package comprises: a ceramic substrate having a cavity for disposing a semiconductor device therein and a glass layer on a first main surface of the ceramic substrate, a ceramic cap having a glass layer on a second main surface thereof, a plurality of lead frames supported by opposing the first and second main surfaces to each other, and the semiconductor device being hermetically sealed in the cavity by fusing the first and second glass layers.

According to a feature of this invention, the first main surface of the ceramic substrate is formed by a metallized layer; the glass layer is formed on the metallized layer, leaving a narrower outer periphery of the substrate; 70 to 90% of the lead frames are connected directly to a pad of the semiconductor device by way of metal wires; and a remainder thereof is connected indirectly to the pad the semiconductor device by way of the metallized layer.

According to another feature of this invention, the remainder of to 90% of the lead frames, the metallized layer and the pad of the semiconductor device are connected to each other by way of the metal wires.

The above, and other objects, features and advantages of the invention will become apparent from the following description read in conjunction with accompanying drawings, in which like reference numerals designate the same devices.

DETAILED DESCRIPTION OF THE PREFERRED EMBODIMENTS

Figure 1:
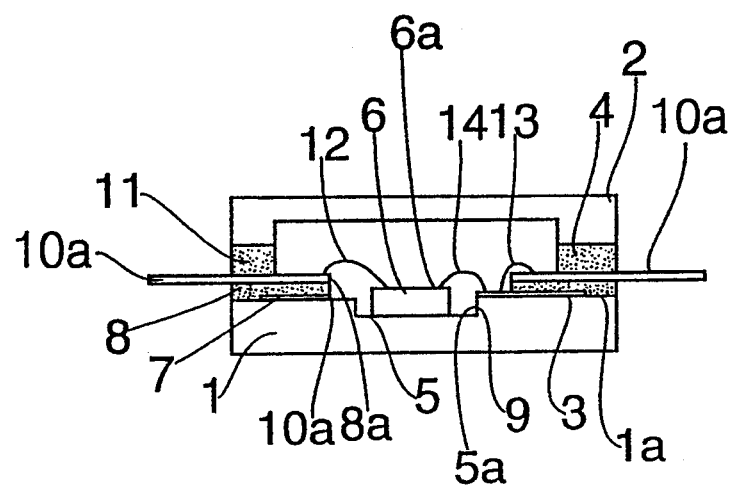
FIG. 1 is a vertical section view of an embodiment of a glass sealing type ceramic package according to this invention.

In FIG. 1 there is shown a glass sealing type ceramic package, in which a semiconductor device 6 having a pad 6a thereupon is disposed in a cavity 5 formed in the center of a ceramic substrate 1 having a rectangular configuration. Both of ceramic substrate 1 and a ceramic cap 2 are facing each other, opposing respective front surfaces 3 and 4 thereof to each other. Cavity 5 is coated with a suitable non-conductive adhesive agent, and semiconductor device 6 is placed on the coated cavity, then heated and fixed therein. Thus, a space between ceramic substrate 1 and ceramic cap 2 can be sealed hermetically.

Ceramic substrate 1 and ceramic cap 2 are made of an alumina ceramic by a known process, but it may be made of mullite, cocinerite, aluminum nitride or the like.

Main surface 3 of ceramic substrate 1 is provided with a metallized layer 7 which is formed by an aluminum evaporation. It may be formed by an ion plating. The aluminum evaporation will be carried out by the following process. First, cleaned ceramic substrate 1 is disposed in a recess of a lower jig having a magnet, and then cavity 5 is masked. Next, a non-evaporated portion of metallized layer is covered by an upper jig. Then, metallized layer is aluminum-evaporated.

Figure 2A:
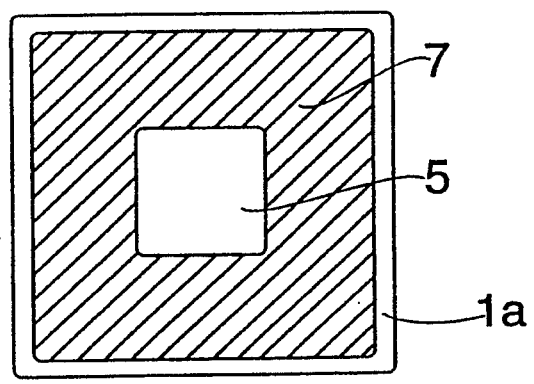
FIG. 2(a) is a section view of a ceramic substrate in FIG. 1, in which a metallized layer is formed.
Figure 2B:
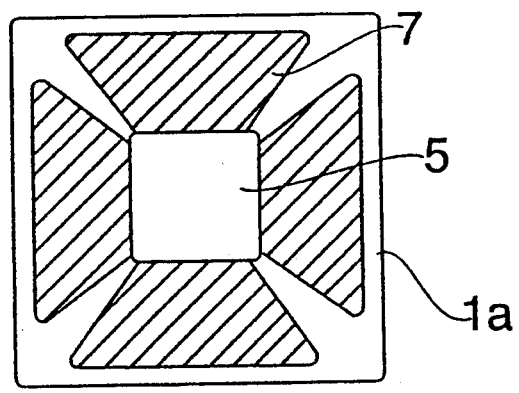
FIG. 2(b) is section view of another modification of the ceramic substrate.
Figure 3:
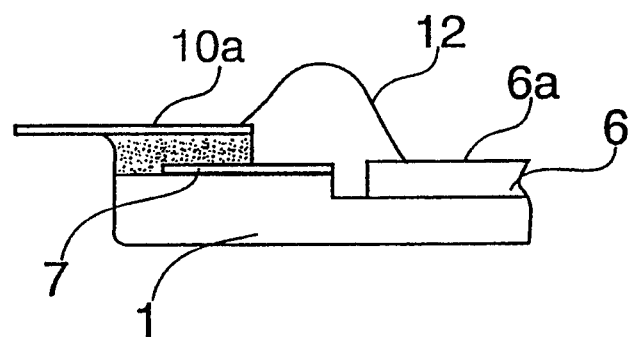
FIG. 3 schematic enlarged section view of an embodiment according to this invention, in which a semiconductor device is connected directly-to a plurality of lead frames by way of metal wires.
Figure 4:
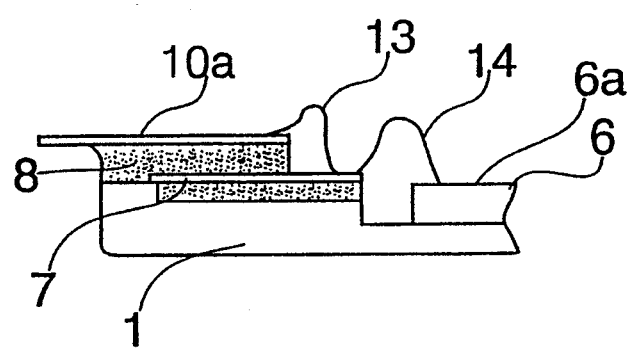
FIG. 4 is a schematic enlarged section view of the foregoing embodiment, in which the semiconductor device is connected indirectly to the plurality of lead frames by way of a metallized layer.
Figure 5:
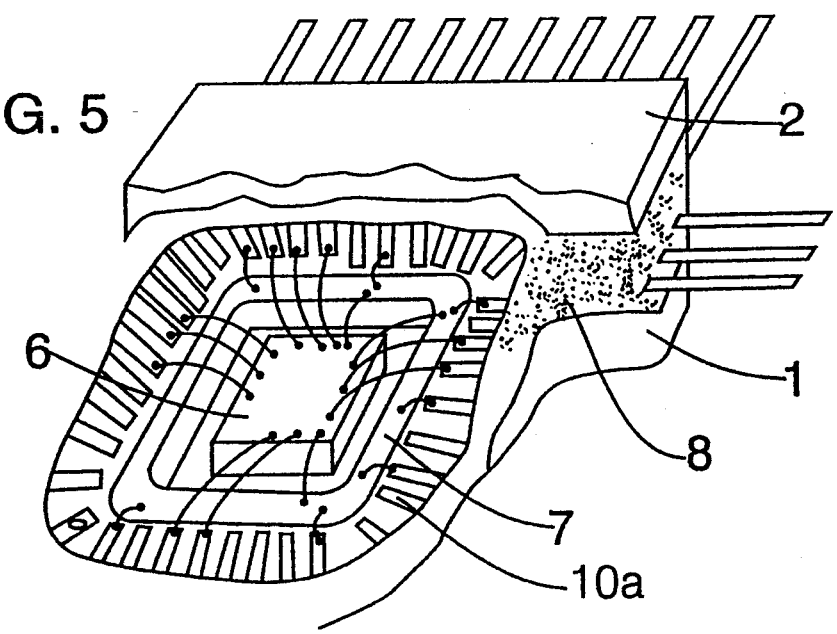
FIG. 5 is a partially exploded perspective view of the ceramic package according to this invention.
Figure 6:
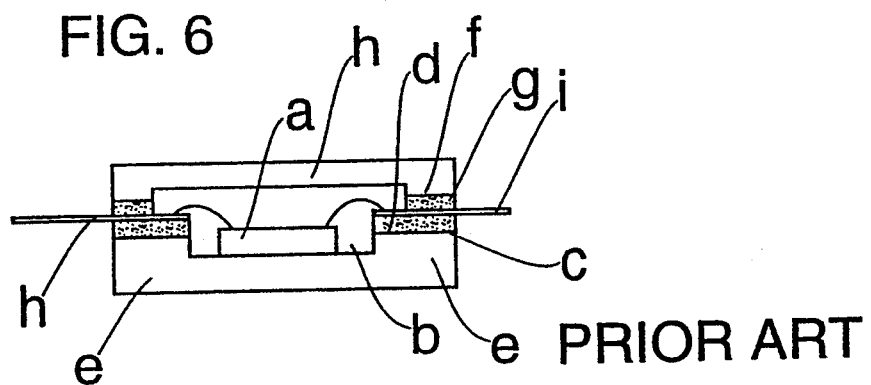
FIG. 6 a vertical section view of a conventional glass sealing type ceramic package.
Figure 7:
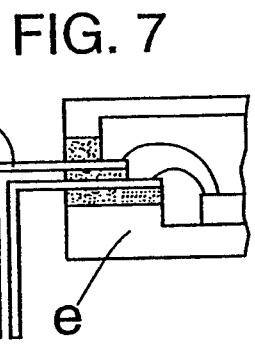
FIG. 7 is a schematic section view of a two-stage lead frame.

As shown in FIGS. 2(a) and 2(b), metallized layer 7 is formed on a most part of main surface 3 of ceramic substrate 1. In FIG. 2(a), metallized layer 7 is formed from an internal periphery 5a of cavity 5, leaving a non-evaporated, narrower outer peripheral portion 1a of ceramic substrate 1. In FIG. 2(b), metallized layer 7 is formed in a radial and angular form, leaving non-evaporated outer peripheral portion 1a.

A first glass layer 8 is formed on a top surface of metallized layer 7 by coating a seal glass by a printing process and baking it. A plurality of lead frames 10 are disposed in such a manner that each inner end 10a of lead frames 10 is aligned with an end 8a of glass layer 8. Each of lead frames 10 is fixed with glass layer 8 by heating. Lead frames 10 are made of cobal Fe—Ni—Co, 42 alloy or the like. Ceramic cap 2 is also made of alumina. A second glass layer 11 is formed on a second main surface 4 of ceramic cap 2 by coating a seal glass by the printing process and baking it.

Semiconductor device 6 which is disposed, then heated and fixed in cavity 5 is connected to a plurality of leads 10a on a lead frame 10 by way of a plurality of metal wires 12, 13 and 14 which are made of aluminum, gold or the like. This is a so-called wire bonding. More specifically, 70 to 90% of leads 10a are connected directly to pad 6a of semiconductor device 6 by way of metal wires 12, while a remainder of leads 10a are connected to metallized layer 7 by way of metal wires 13, and metallized layer 7 and pad 6a of semiconductor device 6 are connected to each other by way of metal wires 14. Namely, the remainder of lead frames 10 are connected indirectly to semiconductor device 6.

Then, ceramic cap 2 is covered on ceramic substrate 1, and then glass layer 11 is fused. Thus, ceramic cap 2 and ceramic substrate 1 are fixed with each other to seal semiconductor device 2 hermetically.

In order to confirm the function and effects of the ceramic package, the following sample was prepared: An alumina ceramic substrate of 28 mm×28 mm had 160 lead frames each having 0.65 mm pitch. A main surface of the ceramic substrate was provided with an aluminum evaporated layer. A semiconductor device and each of the lead frames were connected to each other by way of aluminum wires. Then, a self-inductance of this sample was measured. The result was that whereas a conventional device having no aluminum evaporated layer has 10 to 15 nH, this sample has less than 5 nH.

Figure 8:
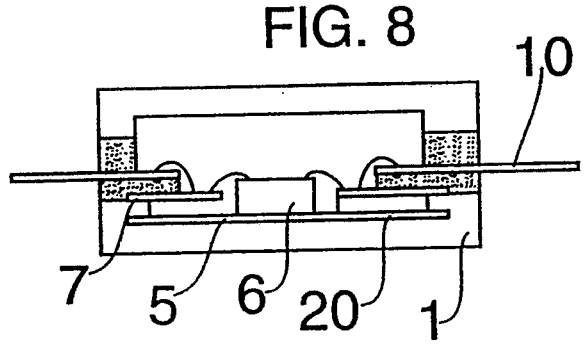
FIG. 8 is section view of a further embodiment of a ceramic package according to this invention.

A further embodiment of the ceramic package according to this invention will be discussed with reference with FIG. 8. In this embodiment, semiconductor device 6 and metallized layer 7 are connected to each other by way of a metallized layer 20 which is made of tungsten, aluminum, gold or the like, as well as by way of a plurality of wires. Metallized layer 20 is disposed under semiconductor device 6 and communicated with cavity 5.

The ceramic package according to this embodiment has succeeded in reducing the increase of inductance due to the multipin system. According to the foregoing embodiment, the ratio of the lead frames for the power supply pad and ground can be within 10 to 30% of the whole thereof. The other lead frames can be used for signal transmission and receiving.

Further, the ceramic package enables a high density wire bonding and a high speed operation. And, it is compact and can be manufactured at a low cost Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A glass sealing type ceramic package for housing a semiconductor device, comprising:
   a ceramic substrate having a cavity with said semiconductor device disposed therein;
   said ceramic substrate having an elevated surface disposed about a periphery of said cavity;
   a metallized layer disposed on said elevated surface of said ceramic substrate;
   said metallized layer on said elevated surface defining an outer ceramic periphery and covering no more than a portion of said elevated surface;
   a first glass layer on said metallized layer and said outer ceramic periphery;
   a lead frame, having a plurality of inwardly facing leads, disposed on said first glass layer;
   first means for connecting a portion of said leads directly to said semiconductor device;
   second means for connecting a remainder of said leads to said semiconductor device through said metallized layer;
   a ceramic cap having a second glass layer disposed about a periphery of said ceramic cap; and
   said semiconductor device is hermetically sealed in said cavity by fusion of said first and second glass layers to each other.

2. A glass sealing type ceramic package for housing a semiconductor device, comprising:
   a ceramic substrate having a cavity with said semiconductor device disposed therein;
   a metallized layer on a surface of said ceramic substrate about a periphery of said cavity;
   said metallized layer on said surface defining an outer ceramic periphery and covering no more than a portion of said surface:
   a first glass layer on said metallized layer and said outer ceramic periphery;
   a lead frame, having a plurality of inwardly facing leads, disposed on said first glass layer;

first means for connecting a portion of said leads directly to said semiconductor device:

second means for connecting a remainder of said leads to said semiconductor device through said metallized layer;

a ceramic cap having a second glass layer disposed about a periphery of said ceramic cap:

said semiconductor device being hermetically sealed in said cavity by fusion of said first and second glass layers to each other: and said portion being 70-90% of a total number of said leads.

3. The glass sealing type ceramic package for housing a semiconductor device according to claim 1, wherein said metallized layer is evaporated aluminum.

4. The glass sealing type ceramic package for housing a semiconductor device according to claim 1, wherein said first and second means for connecting are metal wires.

5. A glass sealing type ceramic package for housing a semiconductor device, comprising:

a ceramic substrate having a cavity with said semiconductor device disposed therein;

a metallized layer on a surface of said ceramic substrate about a periphery of said cavity;

said metallized layer on said surface defining an outer ceramic periphery and covering no more than a portion of said surface;

said metallized layer divided into a plurality of independent conductive sectors;

a first glass layer on said metallized layer and said outer ceramic periphery;

a lead frame, having a plurality of inwardly facing leads, disposed on said first glass layer;

first means for connecting a portion of said leads directly to said semiconductor device;

second means for connecting a remainder of said leads to said semiconductor device through at least one said independent conductive sectors;

a ceramic cap having a second glass layer disposed about a periphery of said ceramic cap; and said semiconductor device is hermetically sealed in said cavity by fusion of said first and second glass layers to each other.

* * * * *